(12) United States Patent
Yang et al.

(10) Patent No.: US 9,984,192 B2
(45) Date of Patent: *May 29, 2018

(54) CELL HAVING SHIFTED BOUNDARY AND BOUNDARY-SHIFT SCHEME

(71) Applicant: Taiwan Semiconductor Manufacturing Company, Ltd., Hsin-Chu (TW)

(72) Inventors: Kuo-Nan Yang, Hsin-Chu (TW); Chou-Kun Lin, Hsin-Chu (TW); Jerry Chang-Jui Kao, Taipei (TW); Yi-Chuin Tsai, Sing-Yan Township (TW); Chien-Ju Chao, Taipei (TW); Chung-Hsing Wang, Baoshan Township (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/043,858

(22) Filed: Feb. 15, 2016

(65) Prior Publication Data

US 2016/0162619 A1 Jun. 9, 2016

Related U.S. Application Data

(63) Continuation of application No. 13/791,406, filed on Mar. 8, 2013, now Pat. No. 9,262,573.

(51) Int. Cl.
*G06F 17/50* (2006.01)

(52) U.S. Cl.
CPC ...... *G06F 17/5072* (2013.01); *G06F 17/5081* (2013.01)

(58) Field of Classification Search
CPC ........... H01L 27/0207; H01L 27/11807; H01L 23/528; H01L 27/11803; H01L 27/108; H01L 29/42392; G06F 17/5072; G06F 17/5077; G06F 17/5068; G06F 17/5081; G06F 17/50; G06F 2217/12; G06F 2217/82; G06F 17/5054; G06F 17/5009; G06F 17/5031; G11C 5/025; H03K 19/0948
USPC .................................................. 716/100–108
See application file for complete search history.

(56) References Cited

U.S. PATENT DOCUMENTS

| 7,895,548 B2 * | 2/2011 | Lin .................... G06F 17/5068 |
| | | 716/122 |
| 8,504,969 B2 | 8/2013 | Lin et al. |
| 8,772,698 B2 | 7/2014 | Fife et al. |
| 2004/0089913 A1 | 5/2004 | Yano et al. |

(Continued)

FOREIGN PATENT DOCUMENTS

| JP | 1140562 A | 2/1999 |
| TW | 200919247 A | 5/2009 |
| TW | 201230311 A | 7/2012 |

*Primary Examiner* — Binh Tat
(74) *Attorney, Agent, or Firm* — Slater Matsil, LLP

(57) ABSTRACT

An embodiment cell shift scheme includes abutting a first transistor cell against a second transistor cell and shifting a place and route boundary away from a polysilicon disposed between the first transistor cell and the second transistor cell. In an embodiment, the cell shift scheme includes shifting the place and route boundary to prevent a mismatch between a layout versus schematic (LVS) netlist and a post-simulation netlist.

20 Claims, 9 Drawing Sheets

(56) References Cited

U.S. PATENT DOCUMENTS

| | | |
|---|---|---|
| 2005/0108669 A1 | 5/2005 | Shibuya |
| 2008/0265361 A1 | 10/2008 | Krauss |
| 2009/0064077 A1 | 3/2009 | Uppaluri et al. |
| 2010/0155783 A1* | 6/2010 | Law ................... H01L 27/0207 |
| | | 257/206 |
| 2014/0258952 A1* | 9/2014 | Yang ................... G06F 17/5081 |
| | | 716/112 |

* cited by examiner

CELL HAVING SHIFTED BOUNDARY AND BOUNDARY-SHIFT SCHEME

This application is a continuation application of U.S. patent application Ser. No. 13/791,406, filed on Mar. 8, 2013, entitled "Cell Having Shifted Boundary and Boundary-Shift Scheme," which application is hereby incorporated herein by reference in their entireties.

BACKGROUND

In semiconductor design, standard cell methodology is a method of designing application-specific integrated circuits (ASICs) with digital-logic features. A standard cell is a group of transistor and interconnect structures that provides a boolean logic function (e.g., AND, OR, XOR, XNOR, inverters) or a storage function (flipflop or latch).

The simplest cells are direct representations of the elemental NAND, NOR, and XOR boolean function, although cells of much greater complexity are commonly used (such as a 2-bit full-adder, or muxed D-input flipflop.)

The initial design of a standard cell is usually developed at the transistor level, in the form of a transistor netlist or schematic view. The netlist is a nodal description of transistors, of their connections to each other, and of their terminals (ports) to the external environment. A schematic view may be generated with a number of different Computer Aided Design (CAD) or Electronic Design Automation (EDA) programs that provide a Graphical User Interface (GUI) for this netlist generation process.

Designers may use additional CAD programs (e.g., SPICE, Spectre, and so on) to simulate the electronic behavior of the netlist by declaring input stimulus (voltage or current waveforms) and then calculating the circuit's time domain (analogue) response. The simulations verify whether the netlist implements the desired function and predict other pertinent parameters, such as power consumption or signal propagation delay.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

The present disclosure will be described with respect to embodiments in a specific context, namely four transistor (4T) cell. The concepts in the disclosure may also apply, however, to standard cells and cells having more or fewer transistors.

Figure 1:
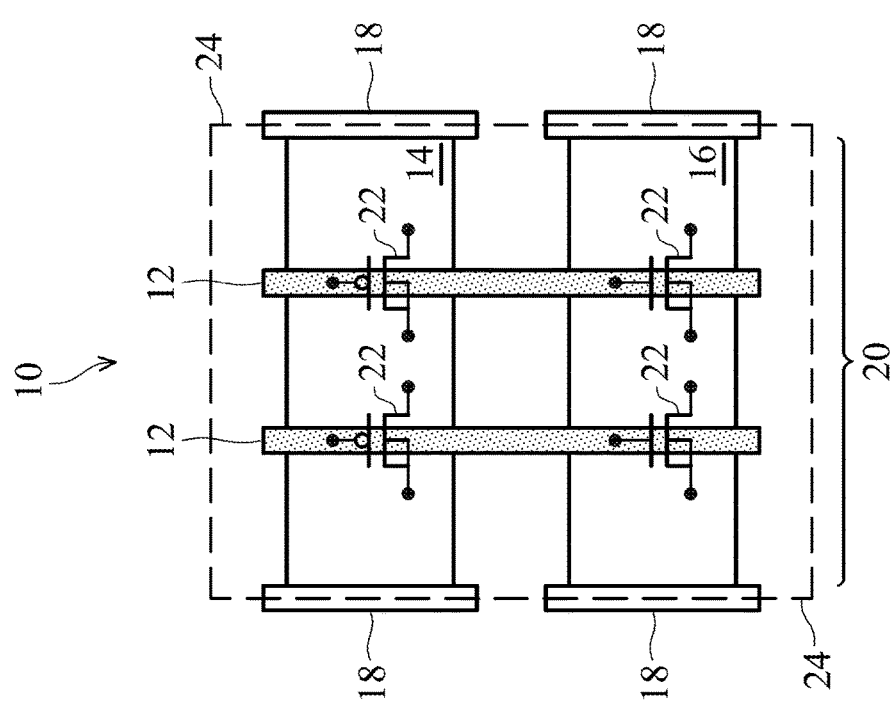
FIG. 1 illustrates a transistor cell having four functional transistors (i.e., a 4T cell) for reference.

Referring now to FIG. 1, a standard cell 10 is illustrated for reference. As shown, the cell 10 includes portions of gate oxide 12 extending over an n-well 14 and a p-well 16 between portions of polysilicon 18 disposed on opposing sides of an active area 20 (a.k.a., an oxide definition (OD) area). The cell 10 of FIG. 1 depicts four functional transistors 22 (a.k.a., active devices) disposed over the gate oxide 12, two of which are NMOS transistors and two of which are PMOS transistors. Because the cell 10 in FIG. 1 includes four transistors, the cell 10 may be referred to as a 4T cell. Even so, it should be recognized that similar cells may include more or fewer transistors (e.g., a 1T cell, a 6T cell, etc.).

As depicted in FIG. 1, the functional transistors 22 are disposed within a place and route (PR) boundary 24. Only a portion of the polysilicon 18 is inside the place and route boundary 24. Indeed, as shown in FIG. 1, about half of the polysilicon 18 is within the place and route boundary 24 while the other half lies outside or beyond the place and route boundary 24. As shown in FIG. 1, the place and route boundary 24 generally identifies the overall footprint of the cell 10 and is suitable for use with Electronic Design Automation (EDA) programs.

Figure 2:
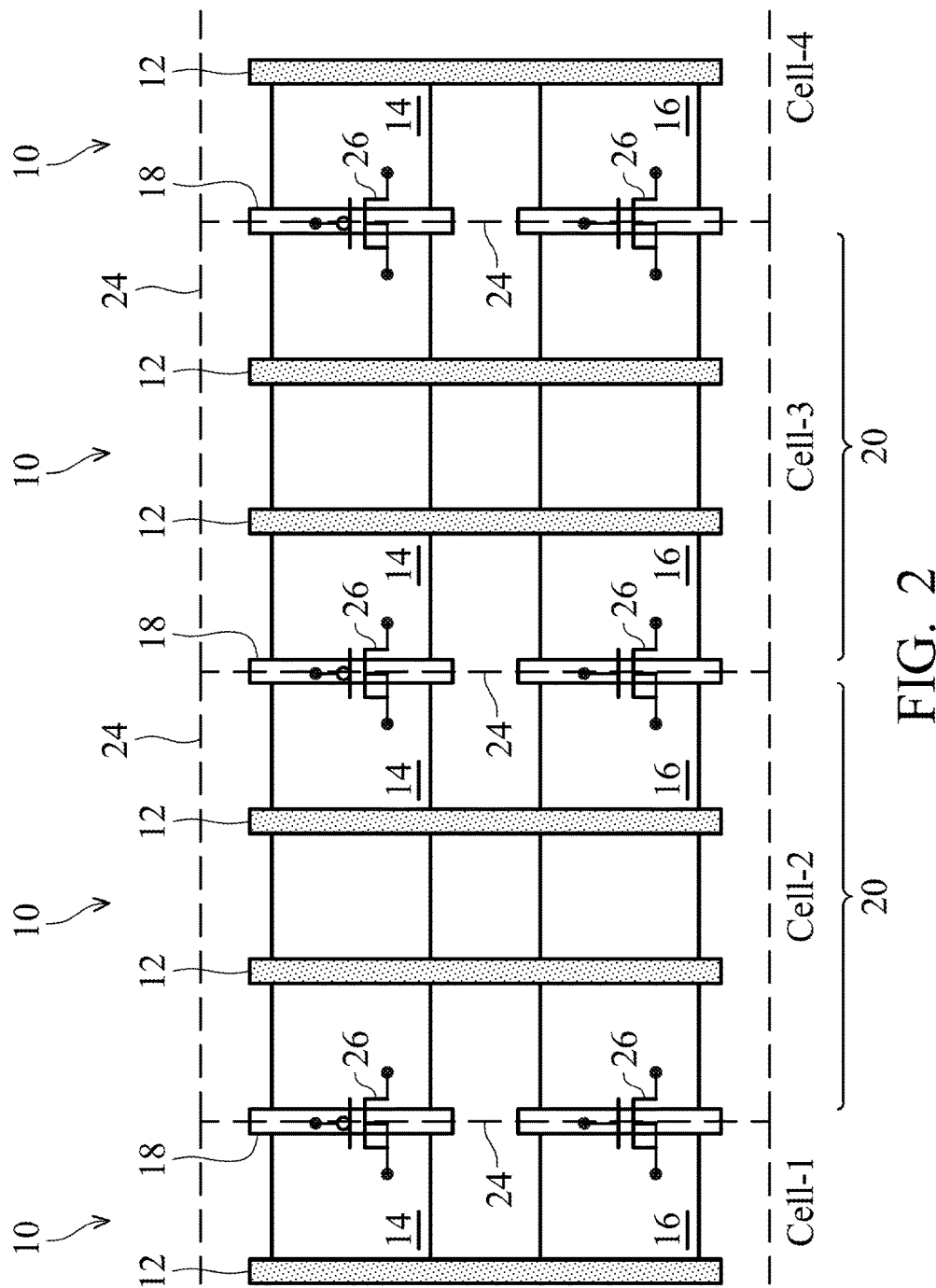
FIG. 2 illustrates parasitic transistors formed between abutting transistor cells.

Referring now to FIG. 2, several of the cells 10 depicted in FIG. 1 are illustrated for reference. As shown, neighboring cells 10 are generally horizontally aligned and abut against one another. Moreover, adjacent cells 10 are disposed on opposing sides of the polysilicon 18. As shown in FIG. 2, the place and route boundary 24 is generally aligned with the polysilicon 18, which insulates the adjacent cells 10 from one another. For the purpose of identification, the cells 10 have been labeled Cell-1, Cell-2, Cell-3, and Cell-4. Despite four cells 10 being depicted in FIG. 2, it should be recognized that many, many more cells 10 may be grouped together in practical applications.

When neighboring cells 10 are arranged to abut with each other to form a continuous active area 20 (i.e., a continuous oxide definition (COD) area) extending from cell 10 to cell 10 as shown in FIG. 2, parasitic transistors 26 are formed. As shown, the parasitic transistors 26 are depicted over the polysilicon 26 proximate the place and route boundary 24 at the lateral edges of the cell 10. For ease of illustration, the functional transistors 22 of FIG. 1 have been omitted from each cell 10 in FIG. 2.

Unfortunately, the parasitic transistors 26 may not be accounted for by circuit designers. Indeed, circuit designers may consider only the functional devices 22 of FIG. 1 in their design and ignore the parasitic devices 26 depicted in FIG. 2. Therefore, the effect of the parasitic transistors 26 on the cell 10 is not considered. In addition, when the polysilicon 18 shared by neighboring cells 10 is partially within and partially outside each cell 10, the parasitic devices 26 located at the edge of the cell 10 become difficult to accurately model or account for. As such, the layout versus schematic (LVS) netlist and the post-simulation netlist generated by the EDA programs will not match. This may cause increasing difficulty in design flow such as, for example, resistance and capacitance (RC) annotation.

Figure 3:
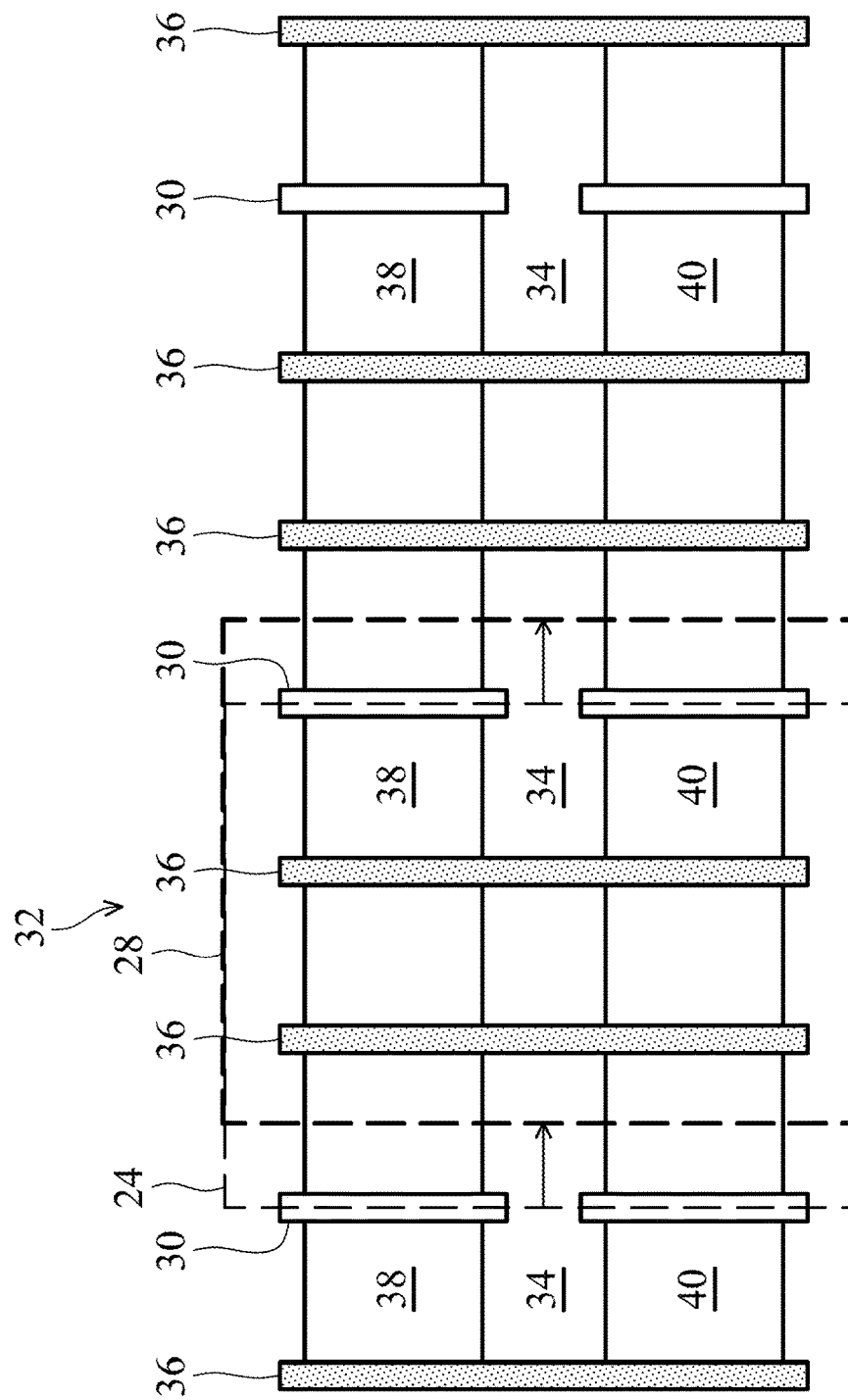
FIG. 3 illustrates a place and route boundary being shifted away from a polysilicon disposed between neighboring transistor cells.

In an effort to account for the parasitic devices, the place and route boundary 24 of FIG. 2 is shifted to define a place and route boundary 28 as illustrated in FIG. 3. As shown in FIG. 3, the place and route boundary 28 is shifted away from the polysilicon 30 disposed between neighboring cells 32. Indeed, the place and shift boundary 28 is shifted away from the polysilicon 30 and onto an active area 34 of the now-defined adjacent transistor cells 32. In particular, as oriented in FIG. 3 a left side of the place and route boundary 28 and a right side of the place and route boundary 28 are each disposed within the active area 24 instead of along the polysilicon 30. Although the place and route boundary 28 is shifted to the right in FIG. 3, it should be recognized that in an embodiment the place and route boundary 28 may also be shifted to the left.

Figure 4:
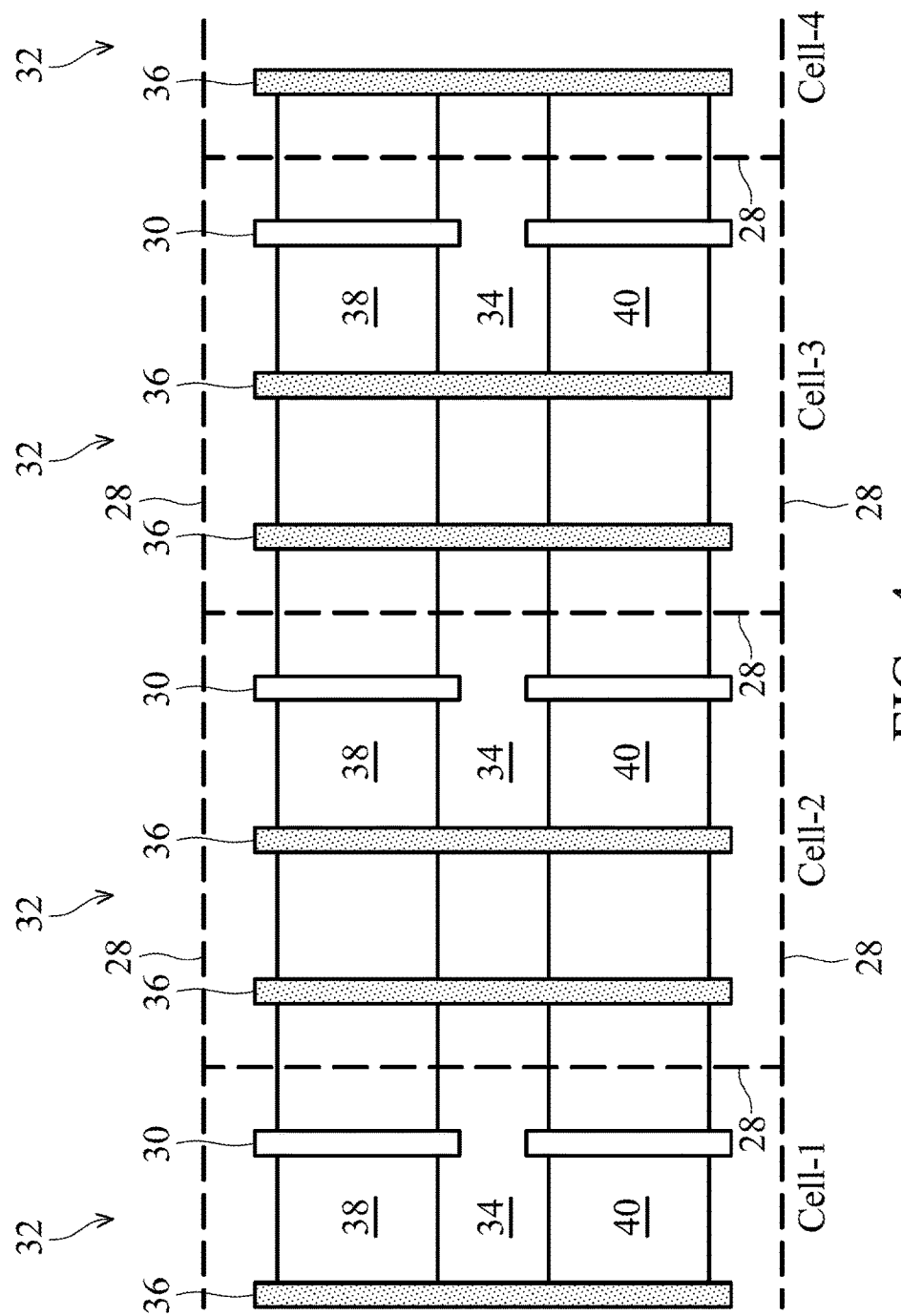
FIG. 4 illustrates a shifted place and route boundary defining adjacent cells.

Continuing, when the place and route boundary 28 of FIG. 2 is shifted to define the place and route boundary 28 as illustrated in FIG. 3, the border or footprint of the transistor cells 32 is generally redefined as shown in FIG. 4. As shown in FIG. 4, the redefined cells 32 include therein the polysilicon 30 along with the portions of gate oxide 36 extending over an n-well 38 and a p-well 40. For the purpose of identification, the cells 32 in FIG. 4 have been labeled Cell-1, Cell-2, Cell-3, and Cell-4. Despite four cells 32 being depicted in FIG. 4, it should be recognized that many, many more cells 32 may be grouped together in practical applications.

Figure 5:
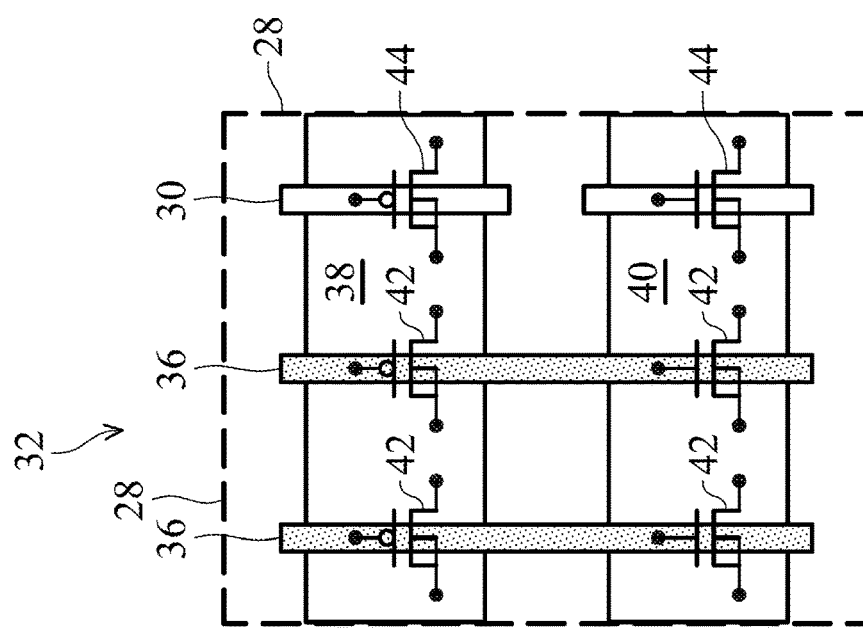
FIG. 5 illustrates functional transistors and parasitic transistors disposed within the shifted place and route boundary.

Referring now to FIG. 5, because the place and route boundary 28 of FIG. 4 has been shifted relative to the place and route boundary 24 of FIG. 3, each cell 32 now includes the functional transistors 42 illustrated over the gate oxide 36 and the parasitic transistors 44 illustrated over the polysilicon 30. Because the parasitic transistors 44 are now disposed with the place and route boundary 28, the parasitic transistors 44 may be accurately modeled or accounted for when the EDA programs are utilized.

Indeed, because there is no partial polysilicon 18 overlapping neighboring cells 10 (see FIG. 2) the parasitic transistors 44 are easier for circuit designers to deal with. In other words, shifting the place and route boundary 28 to the position shown in FIGS. 4-5 generally prevents a mismatch between a layout versus schematic netlist and a post-simulation netlist and instead provides a more consistent result between the two netlists. Moreover, the resistance and capacitance (RC) can be annotated on the layout versus schematic netlist to generate the post-simulation netlist.

Figure 6:
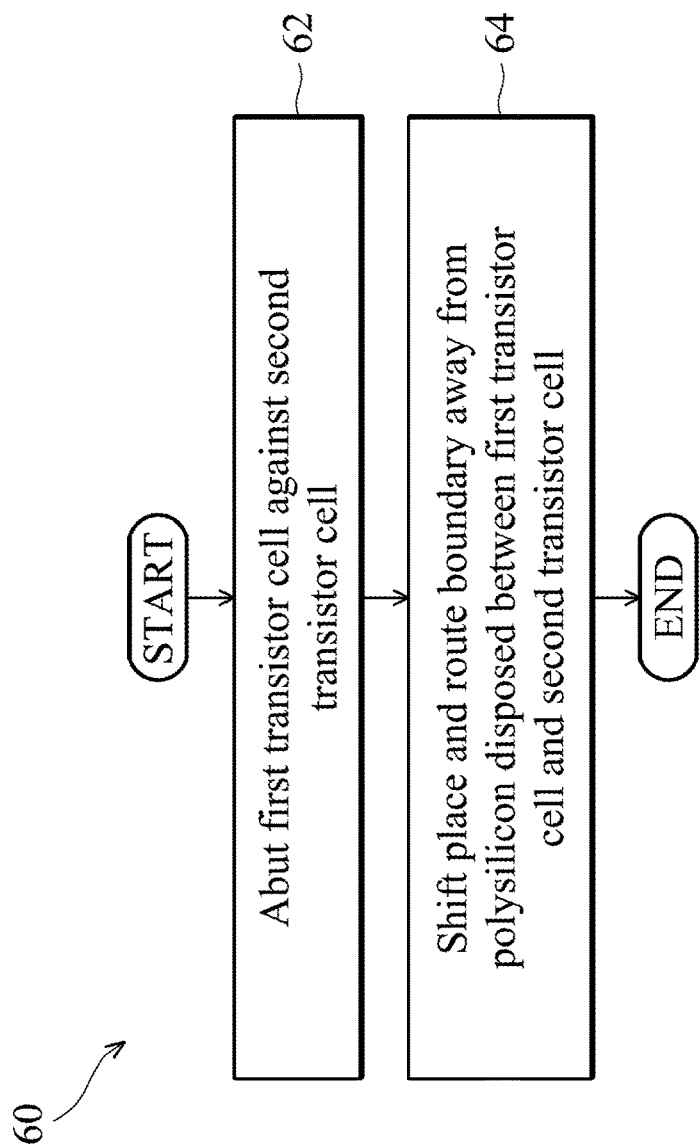
FIG. 6 illustrates an embodiment cell shift scheme.

Referring now to FIG. 6, an embodiment cell shift scheme 60 is provided. In block 62, a first transistor cell is abutted against a second transistor cell. In block 64, a place and route boundary is shifted away from a polysilicon disposed between the first transistor cell and the second transistor cell.

Figure 7:
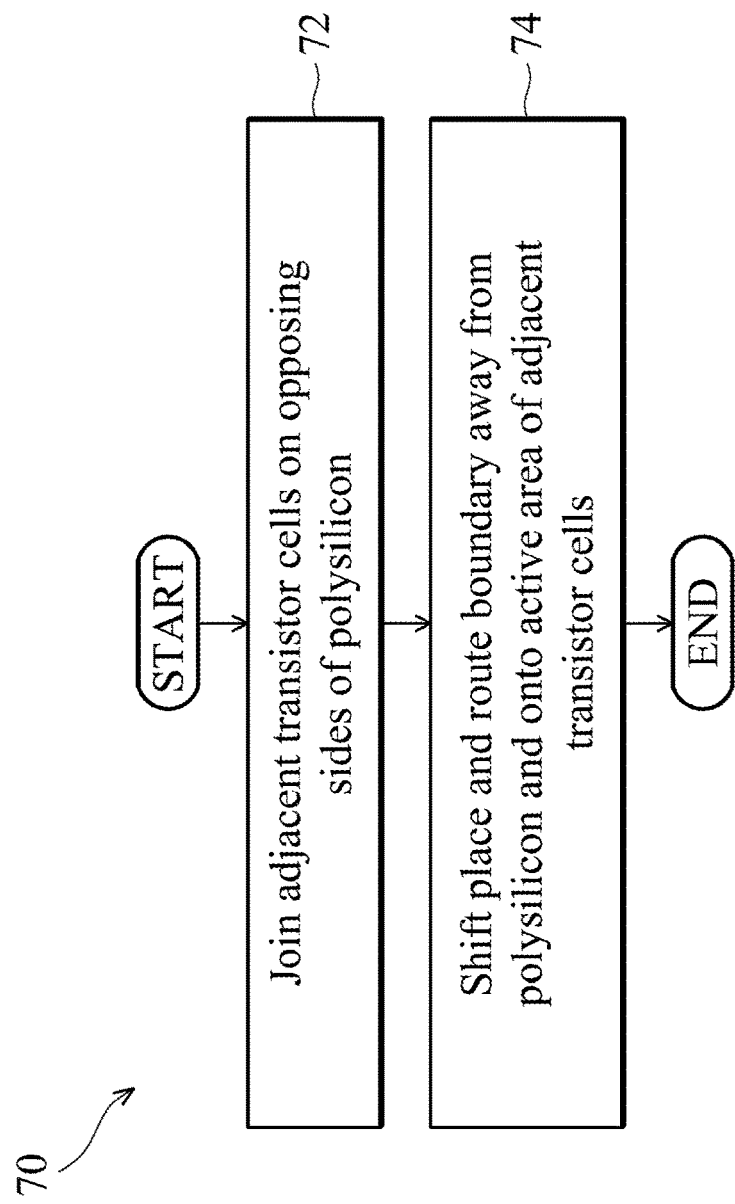
FIG. 7 illustrates an embodiment cell shift scheme.

Referring now to FIG. 7, an embodiment cell shift scheme 70 is provided. In block 72, adjacent transistor cells are joined on opposing sides of a polysilicon. In block 74, a place and route boundary is shifted away from the polysilicon and onto an active area of the adjacent transistor cells.

Figure 8:
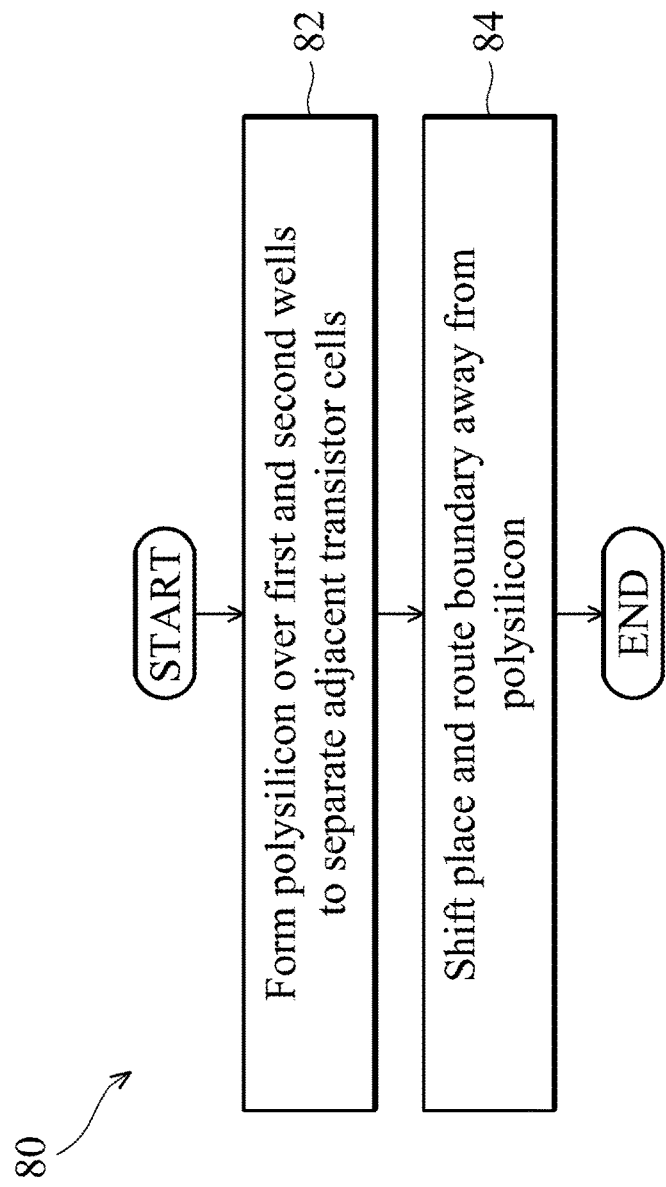
FIG. 8 illustrates an embodiment cell shift scheme.

Referring now to FIG. 8, an embodiment cell shift scheme 80 is provided. In block 82, a polysilicon is formed over first and second wells to separate adjacent transistor cells from each other. In block 84, a place and route boundary is shifted away from the polysilicon.

Figure 9:
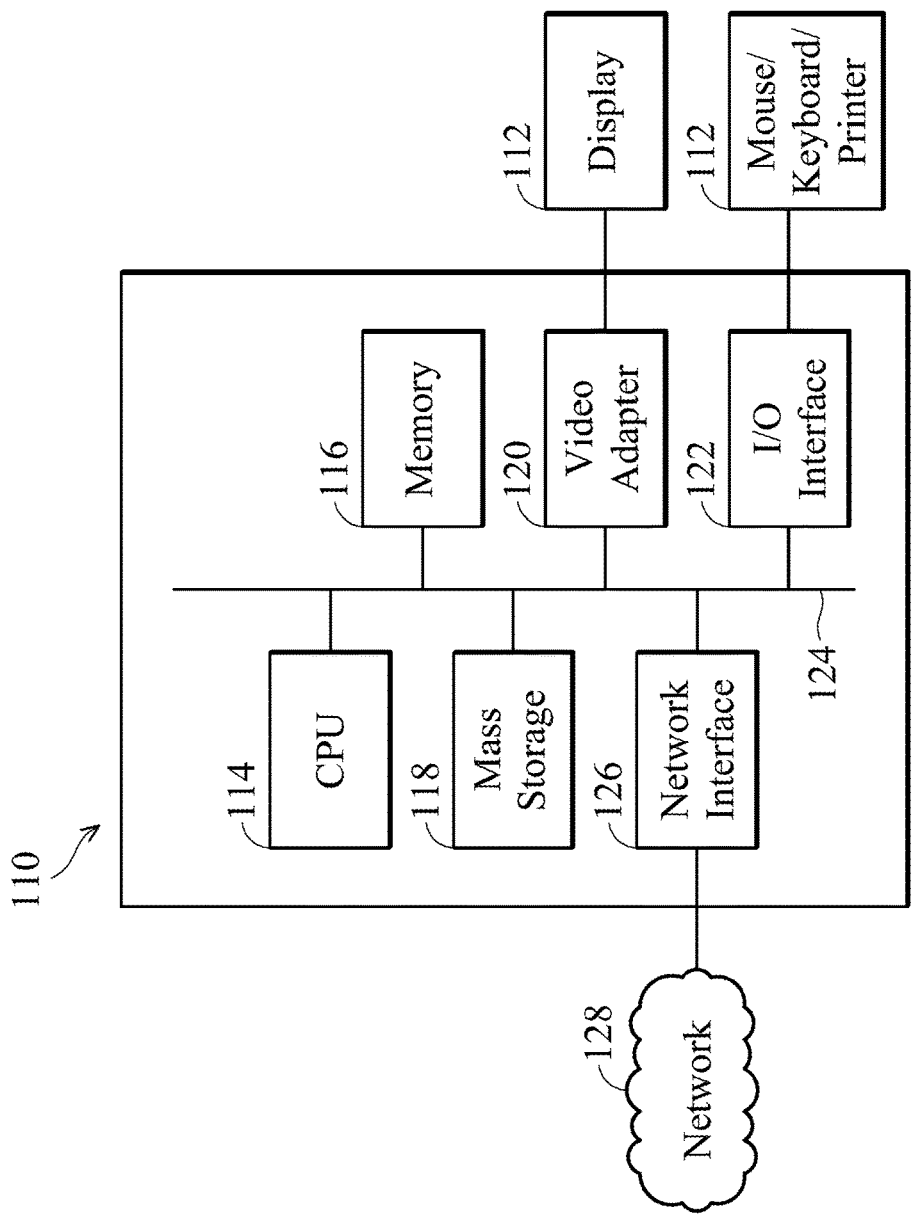
FIG. 9 is a block diagram of a processing system that may be used for implementing the embodiment cell shift schemes or methods disclosed.

FIG. 9 is a block diagram of a processing system 110 that may be used for implementing the methods and devices disclosed herein. Specific devices may utilize all of the components shown, or only a subset of the components, and levels of integration may vary from device to device. Furthermore, a device may contain multiple instances of a component, such as multiple processing units, processors, memories, transmitters, receivers, etc. The processing system 110 may comprise a processing unit equipped with one or more input/output devices 112, such as a speaker, microphone, mouse, touchscreen, keypad, keyboard, printer, display, and the like. The processing system 110 may include a central processing unit (CPU) 114, memory 116, a mass storage device 118, a video adapter 120, and an I/O interface 122 connected to a bus 124.

The bus 124 may be one or more of any type of several bus architectures including a memory bus or memory controller, a peripheral bus, video bus, or the like. The CPU 114 may comprise any type of electronic data processor. The memory 116 may comprise any type of system memory such as static random access memory (SRAM), dynamic random access memory (DRAM), synchronous DRAM (SDRAM), read-only memory (ROM), a combination thereof, or the like. In an embodiment, the memory 116 may include ROM for use at boot-up, and DRAM for program and data storage for use while executing programs.

The mass storage device 118 may comprise any type of storage device configured to store data, programs, and other information and to make the data, programs, and other information accessible via the bus 124. The mass storage device 118 may comprise, for example, one or more of a solid state drive, hard disk drive, a magnetic disk drive, an optical disk drive, or the like.

The video adapter 120 and the I/O interface 122 provide interfaces to couple external input and output devices to the processing unit. As illustrated, examples of input and output devices include the display coupled to the video adapter 120 and the mouse/keyboard/printer coupled to the I/O interface 122. Other devices may be coupled to the processing system 110, and additional or fewer interface cards may be utilized. For example, a serial interface such as Universal Serial Bus (USB) (not shown) may be used to provide an interface for a printer.

The processing system 110 also includes one or more network interfaces 126, which may comprise wired links, such as an Ethernet cable or the like, and/or wireless links to access nodes or different networks. The network interface 126 allows the processing system 110 to communicate with remote systems or units via the networks. For example, the network interface 126 may provide wireless communication via one or more transmitters/transmit antennas and one or more receivers/receive antennas. In an embodiment, the processing system 110 (a.k.a., processing unit) is coupled to a local-area network 128 or a wide-area network 128 for data processing and communications with remote devices, such as other processing units, the Internet, remote storage facilities, or the like.

From the foregoing it should be recognized that by shifting the place and route boundary, no partial polysilicon is included within the transistor cell. Moreover, the device number in the layout versus schematic (LVS) netlist and device number in the post-simulation netlist generated by the EDA programs is the same. In addition, the resistance and capacitance can easily be back annotated without losing devices or nodes.

An embodiment cell shift scheme includes abutting a first transistor cell against a second transistor cell and shifting a place and route boundary away from a polysilicon disposed between the first transistor cell and the second transistor cell.

An embodiment cell shift scheme includes joining adjacent transistor cells on opposing sides of a polysilicon and shifting a place and route boundary away from the polysilicon and onto an active area of the adjacent transistor cells.

An embodiment cell shift scheme includes forming a polysilicon over first and second wells to separate adjacent transistor cells from each other and shifting a place and route boundary away from the polysilicon.

In an embodiment, a method is provided. The method includes providing a layout having first transistor cell abutted against a second transistor cell, wherein a place and route boundary between the first transistor cell and the second transistor cell intersects a polysilicon feature, and shifting, by a computer, the place and route boundary to define a modified first transistor cell comprising the polysilicon feature and a modified second transistor cell. The method further includes creating, by a computer, a netlist in accordance with the modified first transistor cell and the modified second transistor cell, the netlist comprising a device associated with the polysilicon feature, wherein shifting the place and route boundary reduces a mismatch between the netlist and a post-simulation netlist.

In another embodiment, a method is provided. The method includes shifting, by a computer, a place and route boundary between a first cell and a second cell to define a modified place and route boundary, the place and route boundary intersecting a first polysilicon feature, the modified place and route boundary defining a first modified cell and a second modified cell, the modified place and route boundary not intersecting the first polysilicon feature between the first modified cell and the second modified cell. The method further includes creating, by a computer, a netlist in accordance with the modified first cell and the modified second cell, the netlist comprising a device associated with the first polysilicon feature, wherein the first modified cell and the second modified cell reduces a mismatch between the netlist and a post-simulation netlist.

In yet another embodiment, a method is provided. The method includes receiving a first layout having a first cell abutted to a second cell, a place and route boundary comprising an interface between the first cell and the second cell, the place and route boundary intersecting a conductive element, and shifting, by a computer, the place and route boundary to define a modified place and route boundary, the modified place and route boundary defining an interface between a first modified cell and a second modified cell, the modified place and route boundary not intersecting the conductive element between the first modified cell and the second modified cell. The method further includes creating, by a computer, a netlist in accordance with the first modified cell and the second modified cell, the netlist comprising a device associated with the conductive element, wherein the first modified cell and the second modified cell reduces a mismatch between the netlist and a post-simulation netlist.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method comprising:
    providing a layout having a first transistor cell abutted against a second transistor cell, wherein a place and route boundary between the first transistor cell and the second transistor cell intersects a polysilicon feature;
    shifting, by a computer, the place and route boundary to define a modified first transistor cell comprising the polysilicon feature and a modified second transistor cell;
    generating, by a computer, a netlist in accordance with the modified first transistor cell and the modified second transistor cell, the netlist comprising a device associated with the polysilicon feature, wherein shifting the place and route boundary reduces a mismatch between the netlist and a post-simulation netlist; and
    manufacturing a semiconductor chip using the post-simulation netlist.

2. The method of claim 1, wherein a left side of the modified first transistor cell and a right side of the modified first transistor cell are disposed over an active area.

3. The method of claim 1, wherein each of the first transistor cell and the second transistor cell includes a plurality of functional transistors.

4. The method of claim 1, wherein each of the first transistor cell and the second transistor cell is a four transistor (4T) memory cell.

5. The method of claim 1, wherein each of the first transistor cell and the second transistor cell comprises a plurality of NMOS transistors and a plurality of PMOS transistors.

6. The method of claim 1, wherein each of the modified first transistor cell and the modified second transistor cell includes a plurality of parasitic transistors.

7. The method of claim 1, wherein both the modified first transistor cell and the modified second transistor cell include functional transistors and parasitic transistors.

8. A method comprising:
    shifting, by a computer, a place and route boundary between a first cell and a second cell to define a modified place and route boundary, the place and route boundary intersecting a first polysilicon feature, the modified place and route boundary defining a first modified cell and a second modified cell, the modified place and route boundary not intersecting the first polysilicon feature between the first modified cell and the second modified cell;
    generating, by a computer, a netlist in accordance with the modified first cell and the modified second cell, the netlist comprising a device associated with the first polysilicon feature, wherein the first modified cell and the second modified cell reduces a mismatch between the netlist and a post-simulation netlist; and
    fabricating a semiconductor chip in accordance with the post-simulation netlist.

9. The method of claim 8, wherein opposing sides of the first modified cell and the second modified cell extend over an active area.

10. The method of claim 8, wherein the first polysilicon feature creates a parasitic transistor.

11. The method of claim 8, wherein each of the first modified cell and the second modified cell comprises one or more parasitic transistors.

12. The method of claim 8, wherein the place and route boundary intersects a second polysilicon feature.

13. The method of claim 12, wherein the modified place and route boundary does not intersect either the first polysilicon feature or the second polysilicon feature.

14. The method of claim 8, wherein both the first modified cell and the second modified cell include functional transistors and a parasitic transistor.

15. A method comprising:
receiving a first layout having a first cell abutted to a second cell, a place and route boundary comprising an interface between the first cell and the second cell, the place and route boundary intersecting a conductive element;
shifting, by a computer, the place and route boundary to define a modified place and route boundary, the modified place and route boundary defining an interface between a first modified cell and a second modified cell, the modified place and route boundary not intersecting the conductive element between the first modified cell and the second modified cell;
generating, by a computer, a netlist in accordance with the first modified cell and the second modified cell, the netlist comprising a device associated with the conductive element, wherein the first modified cell and the second modified cell reduces a mismatch between the netlist and a post-simulation netlist; and
using the post-simulation netlist to manufacture a semiconductor chip.

16. The method of claim 15, wherein the conductive element comprises a polysilicon feature.

17. The method of claim 15, wherein each of the first modified cell and the second modified cell comprises a plurality of longitudinal conductive features, wherein the conductive element is parallel to the plurality of longitudinal conductive features.

18. The method of claim 15, wherein the first modified cell comprises a first polysilicon feature and the second modified cell comprises a second polysilicon feature.

19. The method of claim 18, wherein the first polysilicon feature is parallel to a first gate electrode of a first transistor, and the second polysilicon feature is parallel to a second gate electrode of a second transistor.

20. The method of claim 15, wherein each of the first modified cell and the second modified cell comprises a plurality of NMOS transistors and a plurality of PMOS transistors.

* * * * *